United States Patent [19]
Liao et al.

[11] Patent Number: 4,961,822
[45] Date of Patent: Oct. 9, 1990

[54] FULLY RECESSED INTERCONNECTION SCHEME WITH TITANIUM-TUNGSTEN AND SELECTIVE CVD TUNGSTEN

[76] Inventors: Kuan Y. Liao, 3932 Capri; Yu C. Chow, 4901 Flagstar, both of Irvine, Calif. 92714; Maw-Rong Chin, 19172 Homestead La., Huntington Beach, Calif. 92646; Charles S. Rhoades, 1711 Huntington St. #4, Huntington Beach, Calif. 92648

[21] Appl. No.: 338,681

[22] Filed: Apr. 17, 1989

[51] Int. Cl.$^5$ .................... H01L 21/306; B44C 1/22; C03C 15/00; C23F 1/02
[52] U.S. Cl. .................... 156/656; 156/653; 156/655; 156/657; 156/659.1; 156/661.1; 156/662; 357/71; 357/23.1; 437/192; 437/203; 437/228; 437/246
[58] Field of Search ............... 156/643, 644, 650, 652, 156/653, 655, 656, 657, 659.1, 661.1, 662, 664; 357/23.1, 23.14, 41, 42, 44, 49, 71; 437/40, 41, 59, 62, 189, 190, 191, 192, 193, 194, 203, 228, 246

[56] References Cited

U.S. PATENT DOCUMENTS

| | | | |
|---|---|---|---|
| 4,624,864 | 11/1986 | Hartmann | 437/193 X |
| 4,666,737 | 5/1987 | Gimpelson et al. | 437/192 |
| 4,708,767 | 11/1987 | Bril | 437/192 X |
| 4,801,559 | 1/1989 | Imaoka | 437/193 |
| 4,808,545 | 2/1989 | Balasubramanyam et al. | 437/192 X |

Primary Examiner—William A. Powell
Attorney, Agent, or Firm—Terje Gudmestad; Wanda K. Denson-Low

[57] ABSTRACT

A method of fabricating higher-order metal interconnection layers in a multi-level metal semiconductor device. The semiconductor device has at least one metal layer, an oxide layer disposed on the metal layer, and a metal plug disposed in the oxide layer connected to the metal layer. A reverse photoresist mask is formed on the oxide layer that is etched to form trenches therein that define the higher-order metal layer. An adhesion layer that comprises titanium tungsten or aluminum is deposited on top of the photoresist mask that contacts the metal plug. A low viscosity photoresist layer is then deposited on top of the adhesion layer. The adhesion layer and low viscosity photoresist layer are then anisotropically etched, and the low viscosity photoresist layer is then removed to expose the adhesion layer. Finally, selective metal, such as tungsten or molybdenum, for example, is deposited on top of the adhesion layer in the trench to form the higher-order metal interconnection layer. Subsequent metal levels may be fabricated by repeating the method starting with the steps of depositing the oxide over the formed higher-order metal lines and forming the metal plugs in the oxide layer.

20 Claims, 2 Drawing Sheets

FULLY RECESSED INTERCONNECTION SCHEME WITH TITANIUM-TUNGSTEN AND SELECTIVE CVD TUNGSTEN

BACKGROUND

The present invention relates generally to methods of processing multi-level metal semiconductor devices, and more particularly to a method of multi-level metal processing that etches troughs in an oxide layer and selectively deposits metal into the troughs to form the higher-order metal lines.

Conventional multi-level metal semiconductor fabrication processes comprise sputtering blanket aluminum onto a blanket dielectric layer, and patterning and etching these blanket layers to define metal lines. The interconnection of the multi-level metal lines is accomplished by the use of contacts and via openings. The conventional procedures have several disadvantages. The patterning and etching of the metal lines creates corrosion and contaminants which result in yield problems. The metal step coverage over via, contact, and the first metal layer requires tight alignment tolerances. It is necessary to planarize the dielectric layer to allow better metal step coverage. The dielectric layer has voids and sleeves at closely spaced metal lines. Aluminum, a primary metal layer material has electromigration, corrosion, hillock and junction spike problems, as are well known in the art.

SUMMARY OF THE INVENTION

In order to overcome the above-mentioned problems in conventional multi-level metal integrated circuit processing, the present invention eliminates the metal etching step by etching the dielectric, and then utilizing a selective metal deposition procedure to form the metal lines. The present invention provides for a method of multi-level metal integrated circuit fabrication that eliminates metal step coverage problems, provides for full planarization of multi-level metal metalization, provides for self-aligned filling of high aspect ratio contacts, vias and metal grooves, and provides electromigration resistant interconnections. The present invention has the advantage of being a simple and practical procedure that produces multi-level integrated circuits.

In particular, the present invention comprises a method of fabricating higher-order metal interconnection layers in a multi-level metal semiconductor device having at least one metal interconnection layer, an oxide layer disposed on the metal interconnection layer, and a metal plug disposed in the oxide layer connected to the metal interconnection layer. The method comprises the following steps.

A reverse photoresist mask is formed on the oxide layer and trenches are formed that define a higher-order metal interconnection layer. The step of forming the reverse photoresist mask generally comprises the following steps. A second oxide layer is deposited on top of the oxide layer and metal plug. A photoresist layer is deposited on top of the second oxide layer. The reverse photoresist mask is then defined. The reverse photoresist mask is etched to form the trenches in the oxide layer. An adhesion layer is deposited on top of the photoresist mask that contacts the metal plug. The adhesion layer typically comprises either titanium tungsten alloy or aluminum alloy, or the like. A low viscosity photoresist layer is deposited on top of the adhesion layer. The adhesion layer and low viscosity photoresist layer are then anisotropically etched. A dip in hot hydrogen peroxide, for example, may be employed to remove the adhesion layer, and specifically titanium tungsten, to a point below the oxide layer, to ensure proper growth of the subsequently deposited selective metal.

The photoresist layers are then removed using a wet stripping procedure to expose the adhesion layer. An additional HF buffer wet etching step may be performed on the anisotropically etched adhesion layer and low viscosity photoresist layer to clean the surface of the adhesion layer. This etching step is performed after the anisotropic etching step. Finally, selective metal, such as tungsten or molybdenum, for example, is deposited on top of the adhesion layer in the trench to form the higher-order metal interconnection layer.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
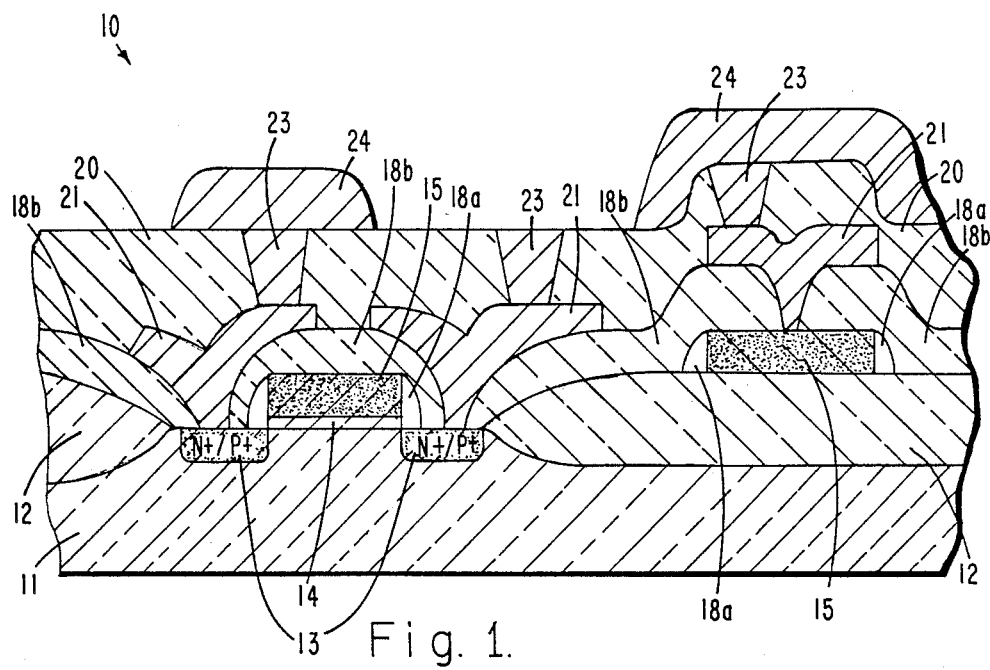
FIG. 1 illustrates a multi-level metal integrated circuit whose higher-order metal lines have been fabricated in accordance with the principles of the present invention.

Referring to FIG. 1, a multi-level metal integrated circuit 10 whose higher-order metal lines have been fabricated in accordance with the principles of the present invention is shown. The integrated circuit 10 comprises a silicon substrate 11 having a thermally grown field oxide layer 12 grown thereon, and having implanted N+/P+ regions 13 in the surface thereof. A gate oxide layer 14 is formed between the implanted N+/P+ regions 13, and a polysilicon layer 15 is deposited on top of the gate oxide layer 14.

A low temperature oxide layer 18 comprising oxide spacer 18a and oxide layer 18b, which may comprise phosphorous silicate glass, for example, is deposited over the field oxide layer 12 and the polysilicon layer 15 and implanted regions 13. Vias are formed in the low temperature oxide layer 18 in a conventional manner to provide access to the N+/P+ regions 13. A first metal interconnection layer comprising metal-1 lines 21 is deposited in the vias as shown. The metal interconnection layer typically comprises aluminum, or the like. A portion of the polysilicon layer 15 forms a polysilicon plug in the low temperature oxide layer 18 to provide access to the gate oxide layer 12.

In accordance with one aspect of the present invention, a second low temperature oxide layer 20 is deposited over the metal-1 lines 21, and metal plugs 23 are formed therein that connect to the metal-1 lines 21. The metal plugs 23 may be comprised of tungsten, or aluminum, or the like. The present invention provides for the formation of second and higher-order metal interconnection lines 24 that connect to the metal plugs 23. The following methods of fabricating these metal lines may be applied to all other higher-order metal interconnection lines.

Figure 2A:
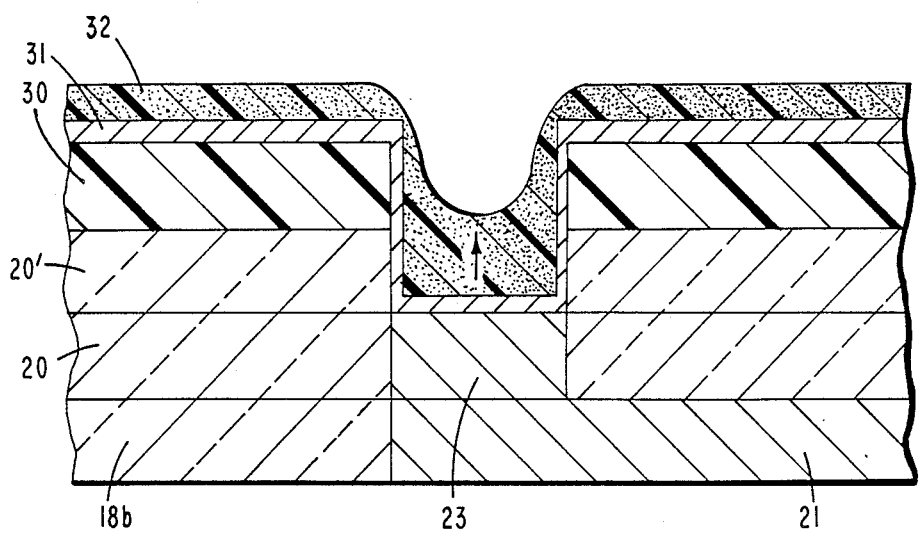
FIGS. 2a-2c illustrate the method of the present invention used to form metal lines in the integrated circuit of FIG. 1.

With reference to FIG. 2a, the first portion of the method of the present invention used to form metal lines 21 in the integrated circuit 10 of FIG. 1 is shown. As shown in FIG. 2a, the metal-1 lines 21, low temperature oxide layer 20 and metal plug 23 are formed in a conventional manner, and then a third low temperature oxide layer 20' is deposited over the low temperature oxide layer 20 and metal plug 23. The metal-1 lines 21 have a thickness on the order of 6.5 microns. The low temperature oxide layer 20 typically has a thickness of about 1.0 micron. The metal plug 23 typically has a thickness of about 1.2 micron. A first photoresist layer 30 is deposited over the third oxide layer 20' and it is masked and etched in a conventional manner to form a trough which defines metal-2 lines which are to be formed. The first photoresist layer 30 typically has a thickness of about 1.2 micron, to match the thickness of the metal plug 23.

A relatively thin adhesion layer 31, or selective metal layer 31, is deposited by means of a sputtering procedure, for example over the etched surface. The adhesion layer 31 typically comprises a metal such as titanium tungsten alloy or aluminum alloy, or the like. The adhesion layer 31 typically has a thickness of about 500–1000 Angstroms. Then a low viscosity photoresist layer 32 is deposited over the adhesion layer 31 which covers the surfaces and partially fills the trench. The low viscosity photoresist layer 32 typically has a thickness of about 3000 Angstroms.

Figure 2B:
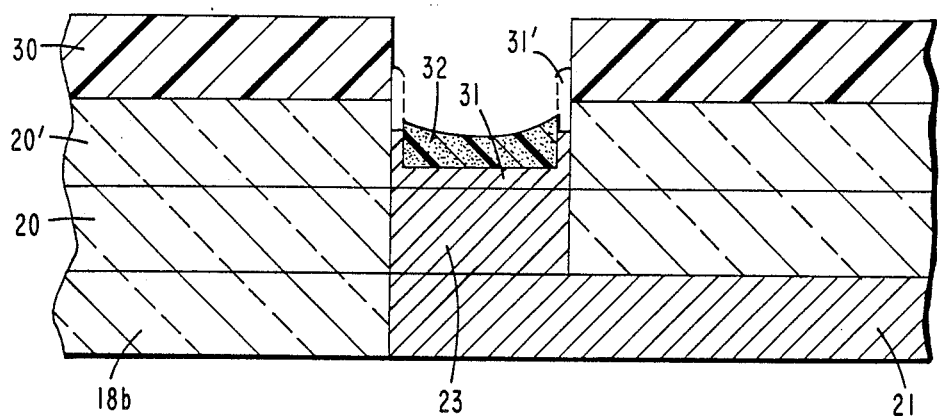

Referring to FIG. 2b, the integrated circuit 10 is then anisotropically etched in a conventional manner such that the adhesion layer 31 is removed to a point below the edge of the third oxide layer 20'. The etching procedure employed is typically an anisotropic dry etching procedure. The low viscosity photoresist layer 32 and topmost portion of the adhesion layer 31 are removed during this procedure. Subsequent to this step, the circuit 10 may be wet etched in a conventional manner to clean the exposed surfaces. The wet etching step removes the first photoresist layer 30 from the surface of the adhesion layer 31. A dip in hydrogen peroxide may be employed to remove the adhesion layer 31 in the area identified by the phantom lined adhesion layer 31' in FIG. 2b. This ensures that no portion of the adhesion layer protrudes above the oxide layer 20'. A preclean treatment may then be performed, if desired using a conventional hydrogen fluoride (100:1) buffer solution, for example.

Figure 2C:
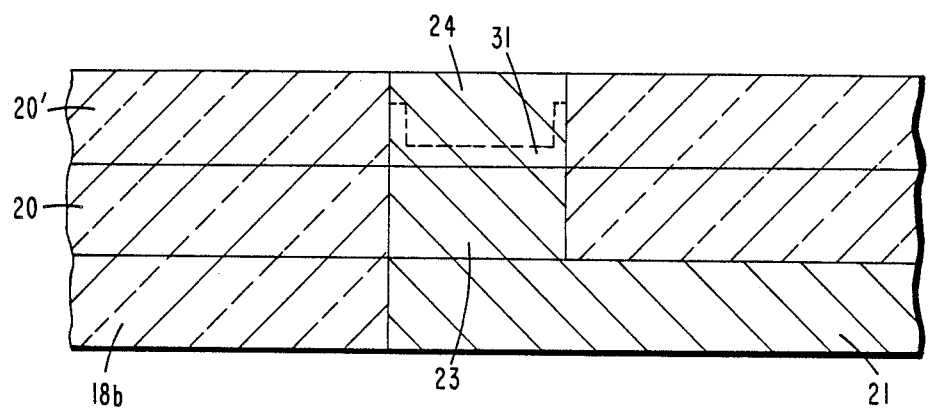

With reference to FIG. 2c, second level metal is deposited into the trench by means of a conventional selective metal chemical vapor deposition procedure. This creates selective metal-2 lines 24 on top of the adhesion layer 31. Typically, selective tungsten is used to form the metal-2 lines 24. In addition, other selective metals such as molybdenum, for example, may be employed as the material used as the selective metal-2 lines 24.

Higher-order metal interconnection lines may also be formed by following the above disclosed procedure. In particular, the next layer of oxide is deposited over the metal-2 lines 24, and a metal plug is formed therein contacting the metal-2 lines. The balance of the processing steps described with reference to FIGS. 2a–2c are then performed. As many lines as is required to complete the integrated circuit 10 may be fabricated using the principles of the present invention.

The metal-2 lines 24 formed in accordance with the principles of the present invention are more electromigration resistant than conventional metal lines. In addition, the present invention eliminates metal step coverage problems, provides for full planarization of multi-level metal metalization, and provides for self-aligned filling of high aspect ratio contacts, vias and metal grooves.

Thus there has been described a new and improved method of multi-level metal integrated circuit processing that uses selective metal, such as selective CVD tungsten, as the metal interconnection formed over an adhesion layer. The present invention eliminates metal etching steps, and therefore eliminates corrosion and contaminants which result in yield problems. The present invention provides for a method of multi-level metal integrated circuit fabrication that eliminates metal step coverage problems, provides for full planarization of multi-level metal metalization, provides for self-aligned filling of high aspect ratio contacts, vias and metal grooves and provides electromigration resistant interconnections. The present invention has the advantage of being a simple and practical procedure that produces multi-level integrated circuits.

It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A method of fabricating higher-order metal interconnection layers in a multi-level metal semiconductor device having at least one metal interconnection layer, an oxide layer disposed on the metal interconnection layer, and a metal plug disposed in the oxide layer connected to the metal interconnection layer, said method comprising the steps of:
    forming a reverse photoresist mask on the oxide layer having trenches therein that define a higher-order metal interconnection layer;
    depositing an adhesion layer on top of the photoresist mask that contacts the metal plug;
    depositing a low viscosity photoresist layer on top of the adhesion layer;
    anisotropically etching the adhesion layer and low viscosity photoresist layer;
    removing the low viscosity photoresist layer to expose the adhesion layer; and
    depositing selective metal on top of the adhesion layer to form the higher-order metal interconnection layer.

2. The method of claim 1 wherein the step of forming a reverse photoresist mask comprises the steps of:
    depositing a second oxide layer on top of the on top of the oxide layer and metal plug;
    depositing a photoresist layer on top of the second oxide layer;
    defining the reverse photoresist mask; and
    etching through the reverse photoresist mask to form the trenches in the oxide layer.

3. The method of claim 1 which further comprises the step of:
    wet etching the anisotropically etched adhesion layer and low viscosity photoresist layer subsequent to clean the surface of the adhesion layer.

4. The method of claim 1 wherein the step of depositing the adhesion layer comprises the step of:

depositing an adhesion layer comprising titanium tungsten alloy.

5. The method of claim 1 wherein the step of depositing the adhesion layer comprises the step of:
depositing an adhesion layer comprising aluminum alloy.

6. The method of claim 1 wherein the step of depositing the adhesion layer comprises the step of:
sputtering an adhesion layer comprising titanium tungsten alloy.

7. The method of claim 1 wherein the step of depositing the adhesion layer comprises the step of:
sputtering an adhesion layer comprising aluminum alloy.

8. The method of claim 1 wherein the step of depositing selective metal on top of the adhesion layer comprises the step of:
chemically vapor depositing selective tungsten on top of the adhesion layer.

9. The method of claim 1 wherein the step of depositing selective metal on top of the adhesion layer comprises the step of:
chemically vapor depositing molybdenum on top of the adhesion layer.

10. A method of fabricating higher-order metal interconnection layers in a multi-level metal semiconductor device having at least one metal interconnection layer, an oxide layer disposed on the metal interconnection layer, and a metal plug disposed in the oxide layer connected to the metal interconnection layer, said method comprising the steps of:
forming a reverse photoresist mask on the oxide layer having trenches therein that define a higher-order metal interconnection layer;
sputtering an adhesion layer on top of the photoresist mask that contacts the metal plug;
depositing a low viscosity photoresist layer on top of the adhesion layer;
anisotropically etching the adhesion layer and low viscosity photoresist layer;
removing the low viscosity photoresist layer to expose the adhesion layer; and
chemically vapor depositing selective metal on top of the adhesion layer to form the higher-order metal interconnection layer.

11. The method of claim 10 wherein the step of forming a reverse photoresist mask comprises the steps of:
depositing a second oxide layer on top of the on top of the oxide layer and metal plug;
depositing a photoresist layer on top of the second oxide layer;
defining the reverse photoresist mask; and
etching through the reverse photoresist mask to form the trenches in the oxide layer.

12. The method of claim 10 wherein the step of depositing selective metal on top of the adhesion layer comprises the step of:
chemically vapor depositing selective tungsten on top of the adhesion layer.

13. The method of claim 10 wherein the step of depositing selective metal on top of the adhesion layer comprises the step of:
chemically vapor depositing molybdenum on top of the adhesion layer.

14. A method of fabricating higher-order metal interconnection layers in a multi-level metal semiconductor device having at least one metal interconnection layer, an oxide layer disposed on the metal interconnection layer, and a metal plug disposed in the oxide layer connected to the metal interconnection layer, said method comprising the steps of:
forming a reverse photoresist mask on the oxide layer having trenches therein that define a higher-order metal interconnection layer by means of the steps of:
depositing a second oxide layer on top of the on top of the oxide layer and metal plug;
depositing a photoresist layer on top of the second oxide layer;
defining the reverse photoresist mask; and
etching through the reverse photoresist mask to form the trenches in the oxide layer;
depositing an adhesion layer on top of the photoresist mask that contacts the metal plug;
depositing a low viscosity photoresist layer on top of the adhesion layer;
anisotropically etching the adhesion layer and low viscosity photoresist layer;
removing the low viscosity photoresist.layer to expose the adhesion layer; and
depositing selective metal on top of the adhesion layer to form the higher-order metal interconnection layer.

15. The method of claim 14 wherein the step of depositing selective metal on top of the adhesion layer comprises the step of:
chemically vapor depositing selective tungsten on top of the adhesion layer.

16. The method of claim 14 wherein the step of depositing selective metal on top of the adhesion layer comprises the step of:
chemically vapor depositing molybdenum on top of the adhesion layer.

17. A method of fabricating higher-order metal interconnection layers in a multi-level metal semiconductor device having a metal interconnection layer, said method comprising the steps of:
depositing an oxide layer on top of a metal interconnection layer;
forming a metal plug in the oxide layer which contacts the metal interconnection layer;
depositing a second oxide layer on top of the oxide layer and metal plug;
depositing a reverse photoresist mask on top of the second oxide layer;
etching the second oxide layer through the reverse photoresist mask;
depositing an adhesion layer on top of the etched surfaces;
depositing a layer of low viscosity photoresist material on top of the adhesion layer;
anisotropically etching the adhesion layer and low viscosity photoresist material;
removing the photoresist materials to expose the adhesion layer;
depositing selective metal on top of the adhesion layer to form the higher-order metal interconnection layer; and
repeating the above steps until the multi-level metal semiconductor device is fabricated.

18. The method of claim 17 which further comprises the step of:
wet etching the anisotropically etched adhesion layer and low viscosity photoresist material to clean the surface of the selective metal layer.

19. The method of claim 17 wherein the step of sputtering an adhesion layer comprises the step of:
sputtering a titanium tungsten alloy layer.

20. The method of claim 17 wherein the step of sputtering an adhesion layer comprises the step of:
sputtering an aluminum alloy layer.

* * * * *